United States Patent
Schmidhammer et al.

(10) Patent No.: US 9,240,622 B2
(45) Date of Patent: Jan. 19, 2016

(54) CIRCUIT ARRANGEMENT INCLUDING HYBRIDS AND DUPLEXERS BETWEEN ANTENNA, TRANSMISSION AND RECEPTION PORTS

(75) Inventors: Edgar Schmidhammer, Stein an der Traun (DE); Juha Ella, Halikko (FI)

(73) Assignee: EPCOS AG, Munich (DE)

( * ) Notice: Subject to any disclaimer, the term of this patent is extended or adjusted under 35 U.S.C. 154(b) by 267 days.

(21) Appl. No.: 13/822,704

(22) PCT Filed: Sep. 20, 2011

(86) PCT No.: PCT/EP2011/066350
§ 371 (c)(1),
(2), (4) Date: May 28, 2013

(87) PCT Pub. No.: WO2012/041739
PCT Pub. Date: Apr. 5, 2012

(65) Prior Publication Data
US 2013/0234806 A1    Sep. 12, 2013

(30) Foreign Application Priority Data

Sep. 27, 2010   (DE) .......................... 10 2010 046 677

(51) Int. Cl.
*H01P 5/12* (2006.01)
*H01P 1/213* (2006.01)
(Continued)

(52) U.S. Cl.
CPC *H01P 5/12* (2013.01); *H01P 1/213* (2013.01); *H03H 7/461* (2013.01); *H03H 7/465* (2013.01);
(Continued)

(58) Field of Classification Search
CPC ....... H03H 7/465; H03H 7/466; H03H 7/468; H03H 7/463; H03H 7/461; H03H 9/0566; H03H 9/706; H03H 9/725; H01P 1/213; H01P 5/12; H01P 5/16; H01P 5/22; H01P 5/227; H04B 1/50; H04B 1/52; H04B 1/525; H04B 1/3827; H04B 1/44; H04B 1/48
USPC ......... 333/101, 117, 118, 120, 121, 126, 129, 333/132, 133; 455/63.1, 73, 78, 80, 82, 83
See application file for complete search history.

(56) References Cited

U.S. PATENT DOCUMENTS 3,517,317 A    6/1970   Sire
6,727,767 B2 *  4/2004   Takada ...................... 331/107 A
(Continued)

FOREIGN PATENT DOCUMENTS

CN          1411632 A       4/2003
DE       100 54 968 A1      5/2002
(Continued)

OTHER PUBLICATIONS

Cheung, S., et al., "Active Quasi-Circulators using Quadrature Hybrids for Simultaneous Transmit and Receive," IEEE MTT-S International Microwave Symposium Digest, 2009. MTT D9, Jun. 7-12, 2009, pp. 381-384.

(Continued)

*Primary Examiner* — Barbara Summons
(74) *Attorney, Agent, or Firm* — Slater & Matsil, L.L.P.

(57) ABSTRACT

A circuit arrangement includes an antenna port, a transmission port, and a reception port, each of which is connected to one respective 90° hybrid that splits an input signal into two output signals that are in quadrature. The circuit arrangement also includes two duplexers which are connected in such a way that the two output signals emitted by the 90° hybrid that is connected to the transmission port constructively interfere on the antenna port, while spurious signals caused by the two output signals destructively interfere on the reception port.

25 Claims, 15 Drawing Sheets

(51) Int. Cl.
*H04B 1/52* (2015.01)
*H03H 9/70* (2006.01)
*H03H 9/72* (2006.01)
*H04B 1/3827* (2015.01)
*H04B 1/525* (2015.01)
*H03H 7/46* (2006.01)

(52) U.S. Cl.
CPC ............... *H03H 9/706* (2013.01); *H03H 9/725* (2013.01); *H04B 1/3827* (2013.01); *H04B 1/52* (2013.01); *H04B 1/525* (2013.01)

(56) References Cited

U.S. PATENT DOCUMENTS

| | | |
|---|---|---|
| 7,123,883 B2 | 10/2006 | Mages |
| 7,330,500 B2 | 2/2008 | Kouki |
| 7,570,622 B2 | 8/2009 | Totsuka et al. |
| 2002/0158712 A1* | 10/2002 | Yamaguchi ............... 333/177 |
| 2003/0076194 A1 | 4/2003 | Machui |
| 2004/0095190 A1* | 5/2004 | Klaren et al. ............ 330/124 R |
| 2005/0104685 A1* | 5/2005 | Kuroki et al. ................ 333/133 |
| 2007/0015468 A1 | 1/2007 | Kouki et al. |
| 2008/0068109 A1 | 3/2008 | Schmidhammer |
| 2008/0212283 A1* | 9/2008 | Chernyakov et al. ........ 361/709 |
| 2009/0069053 A1 | 3/2009 | Kim et al. |
| 2009/0143015 A1* | 6/2009 | Ries et al. .................... 455/63.1 |
| 2009/0268642 A1 | 10/2009 | Knox |
| 2009/0296790 A1 | 12/2009 | Cheung et al. |
| 2010/0148886 A1 | 6/2010 | Inoue et al. |
| 2011/0080229 A1 | 4/2011 | Kenington |
| 2011/0187478 A1 | 8/2011 | Link et al. |
| 2011/0260806 A1 | 10/2011 | Takeuchi |
| 2012/0230227 A1* | 9/2012 | Weiss ........................... 370/277 |

FOREIGN PATENT DOCUMENTS

| | | |
|---|---|---|
| DE | 102 08 169 A1 | 9/2003 |
| DE | 10 2006 031 548 A1 | 1/2008 |
| DE | 10 2008 045 346 A1 | 3/2010 |
| GB | 2 170 358 A | 7/1986 |
| JP | 200378436 A | 3/2003 |
| JP | 2003517239 A | 5/2003 |
| JP | 2004320446 A | 11/2004 |
| JP | 2005064778 A | 3/2005 |
| JP | 2006109512 A | 4/2006 |
| JP | 2007214718 A | 8/2007 |
| JP | 2008177956 A | 7/2008 |
| JP | 2009528759 A | 8/2009 |
| WO | 2009078095 A1 | 6/2009 |
| WO | 2010053131 A1 | 5/2010 |

OTHER PUBLICATIONS

Elzayat, A., et al., "Tx/Rx Isolation Enhancement Based on a Novel Balanced Duplexer Architecture," 2011 IEEE MTT-S International Microwave Symposium Digest (MTT), Jun. 5-10, 2011, pp. 1-4.

Hogerheiden, J., et al., "Improved Planar Spiral Transformer Theory Applied to a Miniature Lumped Element Quadrature Hybrid," IEEE Transactions on Microwave Theory and Techniques, vol. 45, No. 4, Apr. 1997, 3 pages, 543-545.

Laforge, P., et al., "Diplexer Design Implementing Highly Miniaturized Multilayer Superconducting Hybrids and Filters," IEEE Transactions on applied Superconductivity, vol. 19, No. 2, Apr. 2009, 8 pages, 47-54.

Merrimac, "Quadrature Hybrids 90° Power Dividers/Combiners 10 kHz to 40 GHz," General Information, Mar. 21, 1996, 6 pages.

* cited by examiner

28

29

CIRCUIT ARRANGEMENT INCLUDING HYBRIDS AND DUPLEXERS BETWEEN ANTENNA, TRANSMISSION AND RECEPTION PORTS This patent application is a national phase filing under section 371 of PCT/EP2011/066350, filed Sep. 20, 2011, which claims the priority of German patent application 10 2010 046 677.8, filed Sep. 27, 2010, each of which is incorporated herein by reference in its entirety.

TECHNICAL FIELD

The invention relates to a circuit arrangement comprising an antenna port, a transmission port and a reception port, wherein the transmission and reception ports are each connected to the antenna port.

BACKGROUND

The prior art discloses circuits in which the transmission, reception and antenna ports are each connected to an input of a duplexer. In this case, very stringent requirements are placed on the duplexer since it needs to conduct very high transmission powers to the antenna and at the same time needs to conduct signals with a low reception power from the antenna to the receiver port with low losses. An important characteristic for the duplexer circuit is the isolation, which specifies how well a reception port is protected from the high transmission power of a transmission port. Owing to the finite isolation of a real duplexer, a small parasitic component of a transmission signal always passes from the transmission port to the reception port.

U.S. Patent Publication No. 2009/0296790 A1 describes a circuit in which the three ports are interconnected with one another via three 90° hybrids and two ferrite circulators. Such a circuit ensures good isolation. The signal transmitted by the transmission port is first split into two signals which are phase-shifted relative to one another through 90°. These two signals interfere constructively at the antenna port and destructively at the reception port. The circuit described in said document is used in radar technology, in which there are no stringent requirements placed on selection, with the result that this does not play a role here. The selection describes the ratio between the emission power in the passband and the loss outside the passband. Correspondingly, ferrite circulators can be used here which have very poor circulation.

In mobile radio technology, on the other hand, the transmission and reception frequencies are different, with the reception power being very low. In order to be able to process the reception signal, a high degree of selection between the transmission and reception frequencies is critical here.

U.S. Patent Publication No. 2010/0148886 A1 describes a duplexer which has two 90° hybrids. The 90° hybrids are interconnected in such a way that a parasitic signal passes from a transmission port to a reception port on two paths. The signal is phase-shifted through 180° on one of the two signal paths, with the result that signals which pass to the reception port along different paths interfere destructively at the reception port.

SUMMARY OF THE INVENTION

In one aspect, the present invention improves the isolation and the selection for a circuit with transmission, reception and antenna ports.

Embodiments of the present invention provide a circuit arrangement comprising an antenna port, a transmission port and a reception port, in which the antenna, transmission and reception ports are each connected to at least one 90° hybrid. A 90° hybrid divides an input signal into two output signals, wherein the two output signals have a relative phase shift of 90° with respect to one another. The circuit arrangement according to the invention also has two duplexers, which are interconnected in such a way that the two output signals output by the hybrid which is connected to the transmission port interfere constructively at the antenna port and parasitic signals caused by the two output signals interfere destructively at the reception port. Constructive interference of two signals takes place when the two signals are not phase-shifted with respect to one another. Destructive interference arises when the two signals have a phase shift of 180° relative to one another.

BRIEF DESCRIPTION OF THE DRAWINGS

The invention will be explained in more detail below with reference to exemplary embodiments and the associated figures. The figures show, using schematic illustrations which are not to scale, different exemplary embodiments of the invention.

DETAILED DESCRIPTION OF ILLUSTRATIVE EMBODIMENTS

The use of duplexers in the circuit arrangement according to the invention provides marked advantages in comparison with the use of circulators known from the prior art. While a circulator only passes an incoming signal on to the corresponding connection, a duplexer has a filter characteristic. Correspondingly, the selection is markedly improved in the case of duplexers. In addition, a circuit with circulators is susceptible to faults with respect to false assignments at the antenna port. A further disadvantage of the circulators is their large size.

Figure 16:
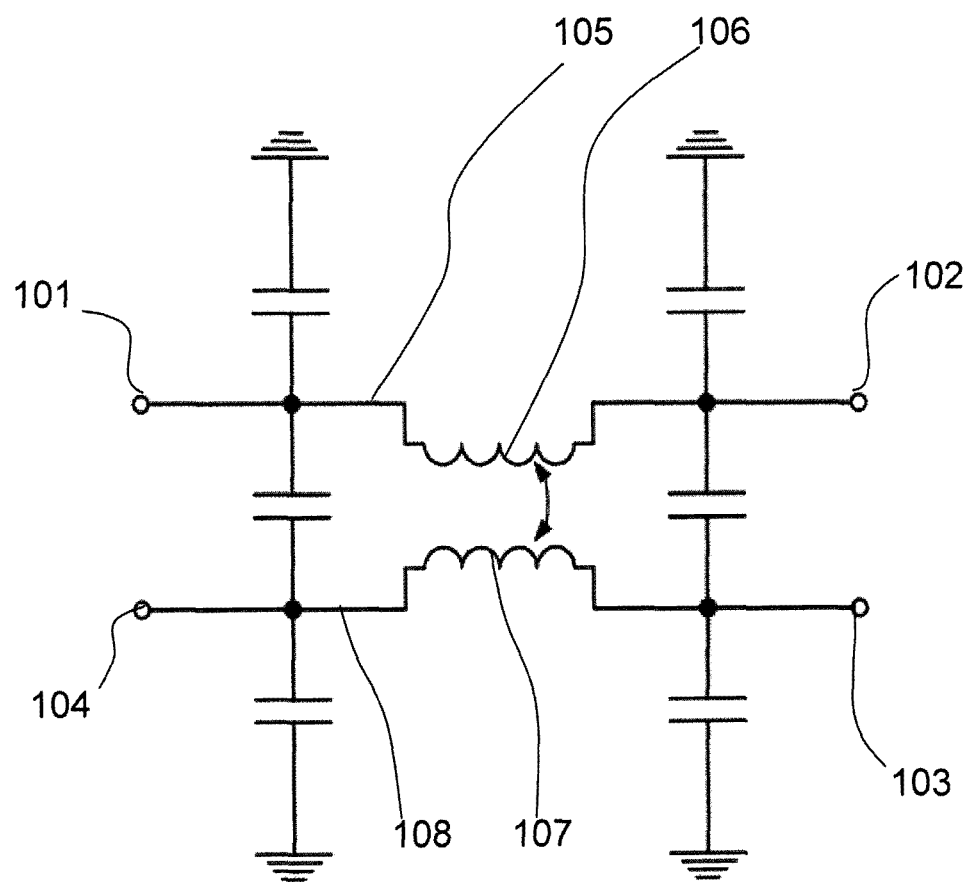
FIG. 16 shows a 90° hybrid comprising discrete elements.
Figure 17A:
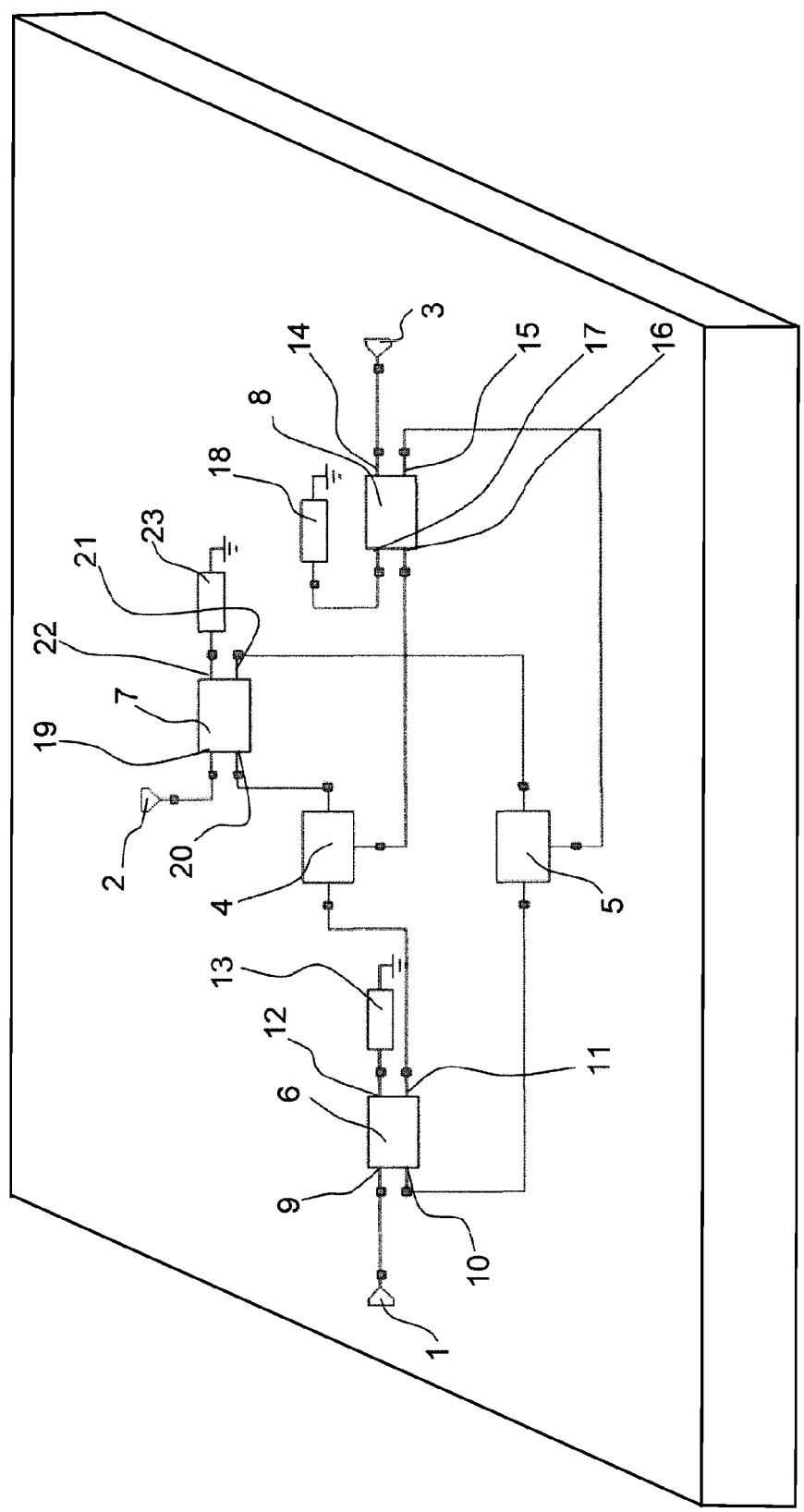
FIGS. 17a and 17b show duplexers and/or the 90° hybrids as discrete components supported by a module substrate or a multi-layered module substrate.
Figure 17B:
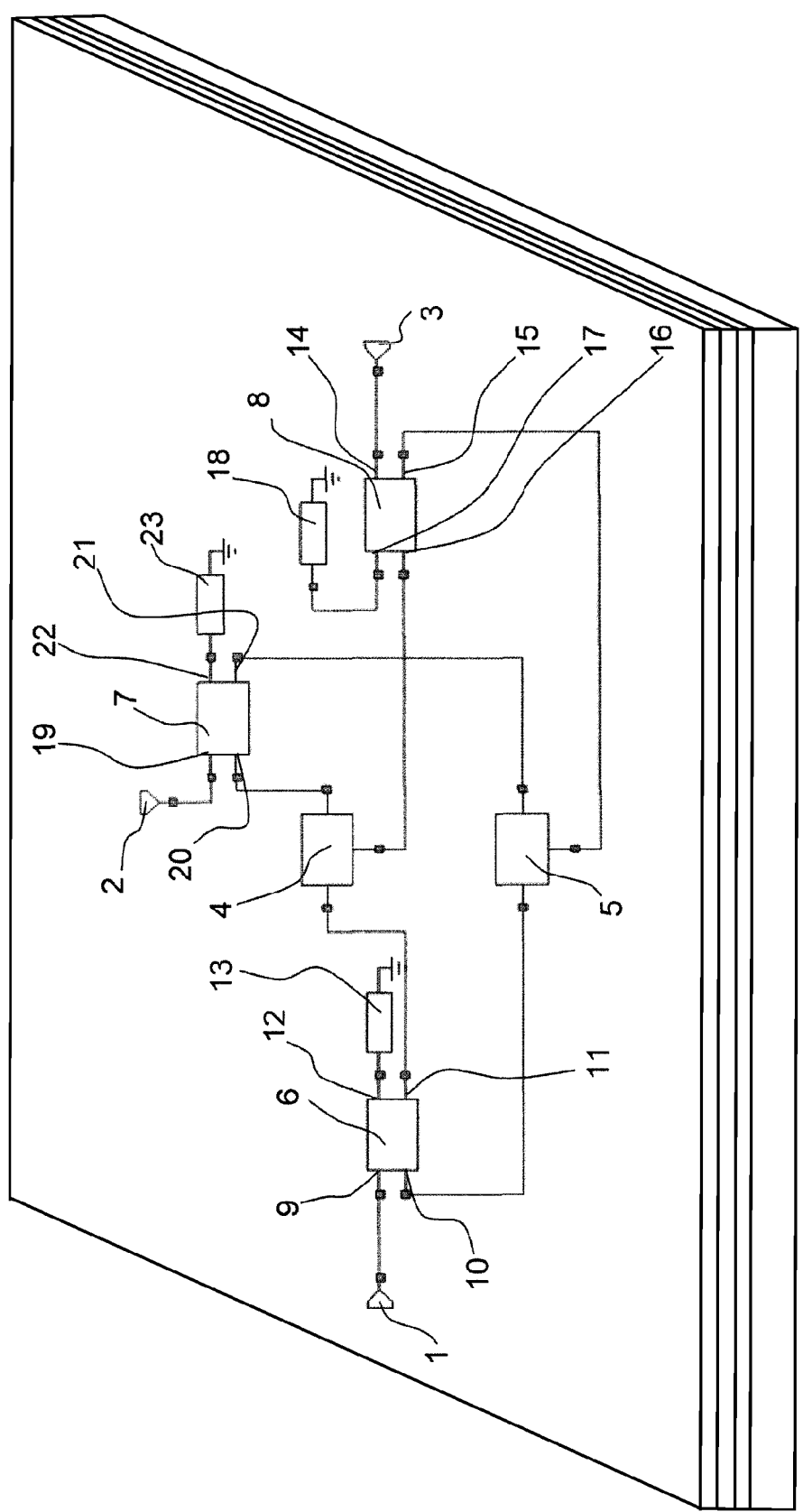

A 90° hybrid is a circuit network with four connections 101, 102, 103, 104. The mode of operation will be explained with reference to a 90° hybrid comprising discrete elements, as illustrated in FIG. 16. The 90° hybrid has a symmetrical design. A signal is applied to the connection 101. The link between the connection 101 and the connection 102 then becomes the main line 105. The main line 105 has an inductance 106. This inductance 106 is magnetically coupled to a further inductance 107 in a subsidiary line 108. Correspondingly, a component of the input signal is coupled out of the main line 105 and coupled into the subsidiary line 108. The connection 103 is connected to an impedance $Z_0$ and terminated by this impedance. If the impedances of the connections 102 and 103 are matched correspondingly, almost the entire signal coupled in at the connection 101 is coupled out at these two connections 102, 103. Correspondingly, virtually no signal component is output at the connection 104 and said connection is virtually isolated.

The signals which are output at the two connections 102 and 103 are phase-shifted relative to one another. The relative phase shift with respect to one another is 90°+Δn. Δn is 0° for an ideal 90° hybrid. In a real 90° hybrid, approximately 3° is conventional for Δn.

In the most general case, the 90° hybrid outputs a signal at the connection 102 which is phase-shifted through the angle $\Phi_1$ with respect to the input signal, while a signal which is phase-shifted through the angle $\Phi_2$ with respect to the input signal is output at the connection 103. In the case of an ideal 90° hybrid, the following is also true: $|\Phi_2-\Phi_1|=90°$. The angles $\Phi_1$ and $\Phi_2$ can assume the values 0° and 90° or the values −45° and +45°, for example.

The coupling constant of the magnetic coupling can be used to adjust which signal component is coupled out of the main line 105 and coupled into the subsidiary line 108.

Various alternatives to a 90° hybrid which comprises discrete elements are known. A 90° can be formed from microstrip conductors, for example, such as the so-called Lange coupler. A further possibility is a branch line coupler. The operating principle remains the same, however. A certain signal component is coupled out of a main line and coupled into a subsidiary line. A connection of this subsidiary line is matched in terms of its impedance, with the result that a phase-shifted signal is output here. The other connection is isolated. If no impedance matching is performed, a signal component which is not negligible is also output at the isolated connection.

The 90° hybrid is used substantially for two functions. An input signal which is present at a first connection of a 90° hybrid is output in the form of two output signals at two further connections again. The output signals each have approximately half the signal strength of the input signal and therefore have a signal strength which is in each case approximately 3 dB lower than the signal strength of the input signal. In the case of an ideal 90° hybrid, the signal strength of the two output signals is precisely 3 dB lower. In the case of a real 90° hybrid, this value is not achieved precisely owing to losses, however. In addition, a relative phase shift between the two output signals of approximately 90° is present.

In complementary fashion to this, a 90° hybrid can also be used to add two signals which are present at two connections. In this case, one of the signals is phase-shifted through 90° prior to the addition.

In addition, a 90° hybrid has a fourth connection. If an input signal is present at a first connection, an output signal with a signal strength which is approximately 3 dB lower is output at the second and third connections. In general, no signal is output at the fourth connection. In this case, however, it is assumed that an impedance matching is provided between all four connections of the 90° hybrid. If the impedance of the connections has not been matched, a signal component which is not negligible is output via the fourth connection.

The four connections are often denoted corresponding to their function by "input," "output 1," "output 2" and "isolated." Since a 90° hybrid has a symmetrical design, each of the four connections can perform each of the functions "input," "output 1," "output 2" or "isolated." This is merely dependent on the connection to which an input signal is applied.

Figure 1:
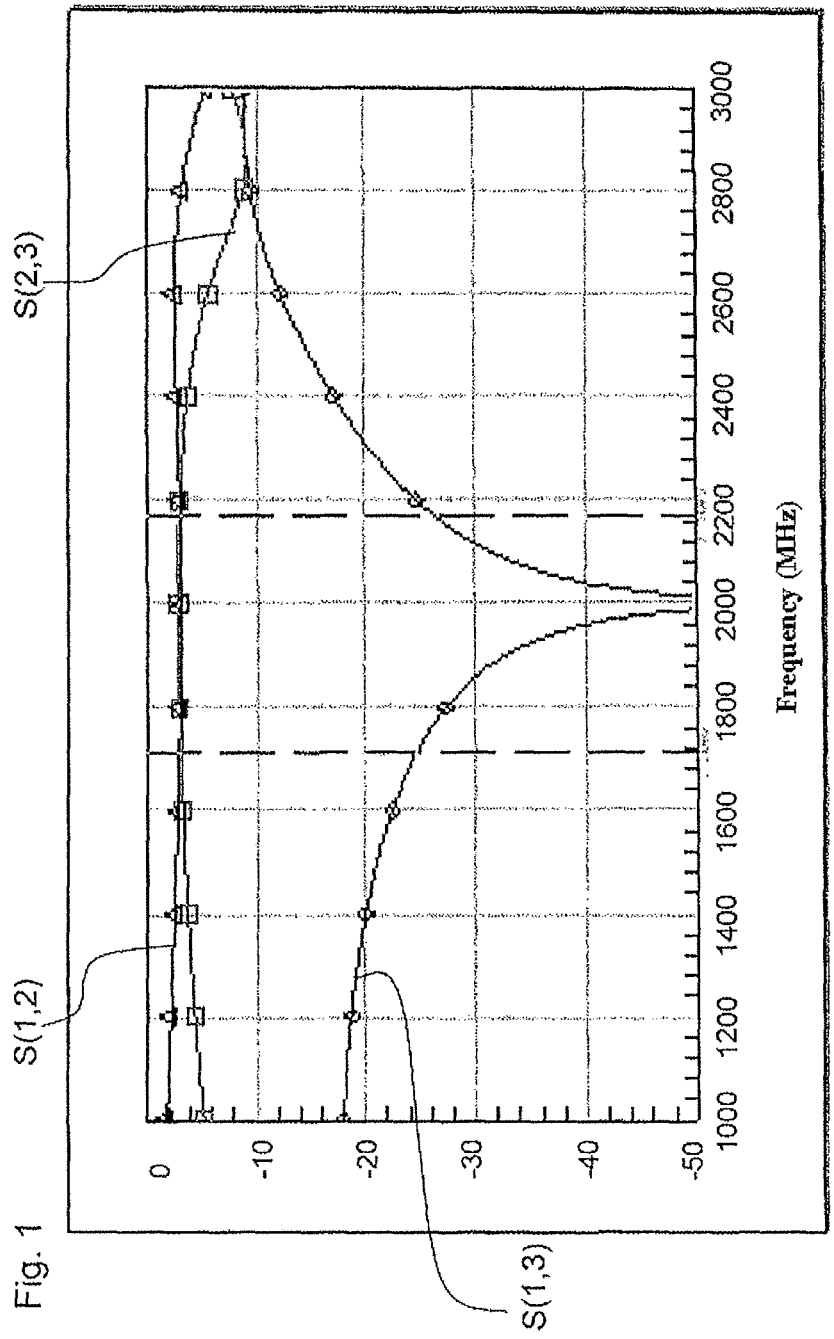
FIG. 1 shows the transmission characteristic of a 90° hybrid.

The characteristic of a 90° hybrid is illustrated with reference to FIGS. 1 and 2. FIG. 1 shows the transmission characteristic of a 90° hybrid, in which a signal is present at the connection "input." The 90° hybrid is designed for a design frequency of 2 GHz, and the connection "isolated" is terminated with 50Ω. The curve $S_{12}$ described the insertion loss for the connection "output 1," and the curve $S_{13}$ correspondingly specifies the insertion loss for the connection "output 2." The curves $S_{12}$ and $S_{13}$ intersect one another at the design frequency of 2 GHz. Correspondingly, at this frequency, the signal strengths of the two output signals are identical. The curve $S_{23}$ also gives the isolation of the 90° hybrid. At the design frequency, this isolation is at a maximum.

Figure 2:
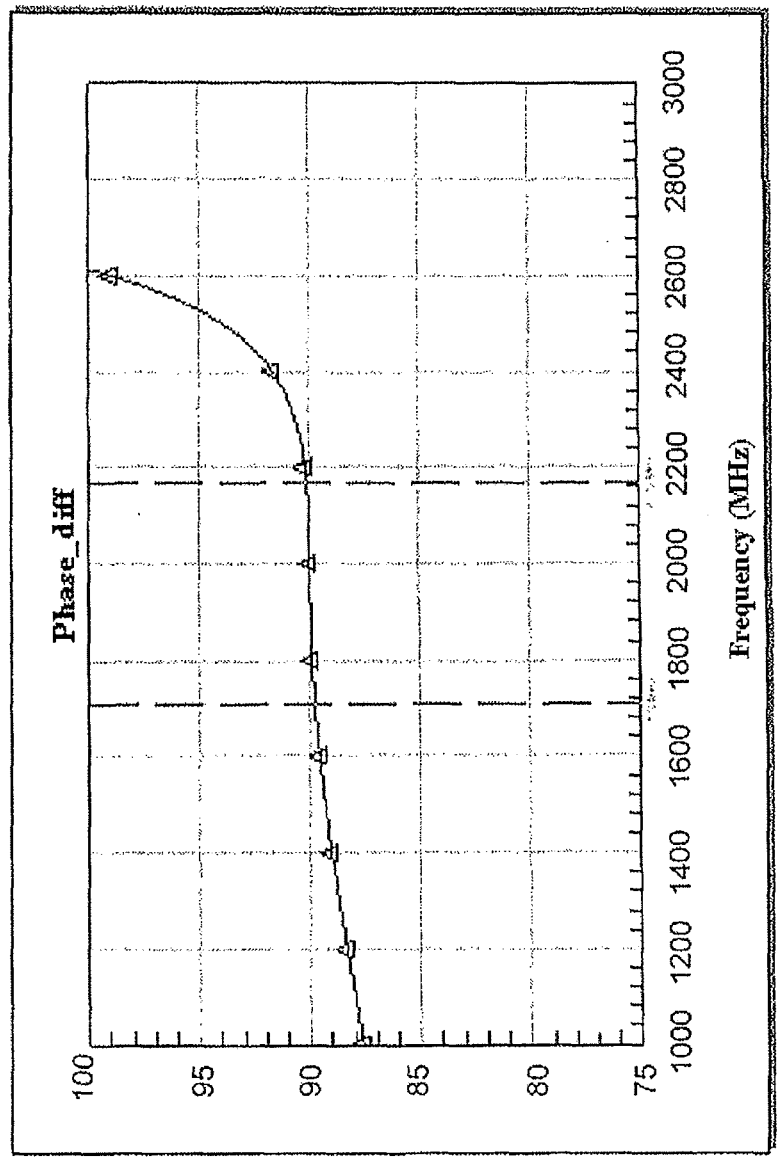
FIG. 2 shows the relative phase shift of the two output signals depending on the frequency of an input signal for a 90° hybrid.

FIG. 2 also shows the relative phase shift of the two output signals depending on the frequency of an input signal. In turn, a 90° hybrid with a design frequency of 2 GHz is assumed. FIG. 2 shows that, in the ideal case, a relative phase shift of 90° between the two output signals also actually occurs only at this design frequency. If the input signal has a lower frequency, the relative phase shift of the two output signals is also less than 90°. Conversely, an input signal with a frequency which is greater than the design frequency results in two output signals which have a relative phase shift of more than 90° with respect to one another. Alternatively, designs of a 90° hybrid are also possible in which an input frequency which is lower than the design frequency results in a relative phase shift of more than 90° between the two output signals and an input frequency which is greater than the design frequency results in a relative phase shift of less than 90° between the two output signals.

In a preferred configuration of the invention, the three connections of each of the two duplexers are each connected to a 90° hybrid. In this case, in each case one 90° hybrid is arranged between the transmission, reception and antenna ports and the two duplexers. Correspondingly, in each case one signal with a signal strength which is lower by approximately 3 dB is present at the two duplexers, in comparison with a circuit in which transmission, reception and antenna ports are connected directly to a duplexer. It follows from this that it is now possible to use duplexers which withstand a lower maximum power. Such duplexers often provide advantages, for example a smaller size, a simpler design and therefore a lower price or alternatively improved insertion loss in the passband given the same price.

In this configuration, one of the two duplexers is connected to the 90° hybrid at the reception port in such a way that this 90° hybrid outputs an output signal, which is phase-shifted through the angle $\Phi_1$ relative to its input signal from the reception port, to the duplexer. This first duplexer is also connected to the 90° hybrid at the transmission port in such a way that this 90° hybrid outputs an output signal, which is phase-shifted through the angle $\Phi_1$ relative to its input signal from the transmission port, to the duplexer. In this way, a first signal path from the transmission port to the reception port is defined, on which a total phase shift of twice $\Phi_1$ results.

In addition, in this case the other of the two duplexers is connected to the 90° hybrid connected to the reception port in such a way that this 90° hybrid outputs an output signal, which is phase-shifted through the angle $\Phi_2$ relative to its input signal from the reception port, to the duplexer. This other of the two duplexers is furthermore connected to the 90° hybrid connected to the transmission port in such a way that this 90° hybrid outputs an output signal, which is phase-shifted through the angle $\Phi_2$ relative to its input signal from the transmission port, to the duplexer. In this second path between the reception port and the transmission port, the phase shifts are added such that, in total, a phase shift of twice $\Phi_2$ results for the signal.

Correspondingly, two signal paths are now present between the transmission port and the reception port, which signal paths have a phase shift of twice $\Phi_1$ or twice $\Phi_2$ relative to the signal which was output from the transmission port. The 90° hybrids are adjusted in such a way that the magnitude of the difference between the angles $\Phi_1$ and $\Phi_2$ is approximately $90°|\Phi_1-\Phi_2|\approx 90°$. In this case, the two signal paths have a relative phase shift of 180° with respect to one another. Therefore, a destructive interference arises at the reception port, with the result that the two signals virtually cancel one another out. Ideally, in the case of a symmetrical design with two physically identical duplexers 4, 5 and the same path length of the signal paths 24, 25, the two signals cancel one another out to 100%.

In addition, in this configuration, the two duplexers are each connected to one of the outputs of the hybrid connected to the antenna port.

The circuit arrangement according to the invention makes it possible to improve the isolation between the transmission and reception channels. Correspondingly, the use of duplexers which do not provide sufficient isolation of the two channels on their own is now also possible. These include in particular duplexers which are designed to be tunable in terms of frequency. Such a so-called tunable duplexer makes it possible to shift the passband of this duplexer within a tuning range and thus to match it to the respectively required transmission and reception channels. By virtue of the circuit arrangement according to the invention, the isolation between the transmission and reception ports can also be maximized in the case of tunable duplexers.

The 90° hybrids can be formed from discrete elements or be formed in the form of microstrip conductors. 90° hybrids which are in the form of microstrip conductors are also referred to as Lange couplers.

The duplexers can be acoustic components, in particular SAW (Surface Acoustic Wave) duplexers or BAW (Bulk Acoustic Wave) duplexers. In addition, a hybrid duplexer could also be used, which has SAW and BAW transducers. Alternatively, duplexers comprising discrete elements are also possible, as well as duplexers whose transmission and reception filters use different technologies, so-called hybrid duplexers. In addition, the duplexers can also have combinations of high-pass filters and low-pass filters.

The circuit arrangement according to the invention can also be designed for various frequency bands without the use of frequency-tunable duplexers, wherein the circuit arrangement then comprises two duplexers per frequency band and has means for switching over between the different duplexers and frequency bands. In this case, it is also possible for the circuit arrangement to have a separate reception port and a dedicated 90° hybrid for each frequency band, wherein the switchover means connect the transmission port selectively to the duplexers associated with different frequency bands.

The present invention also relates to a module which has a circuit arrangement according to the invention. In this case, the duplexers and/or the 90° hybrids can be fitted as discrete components on the module substrate or be integrated in the form of structured metallizations at least partially in the module substrate. In addition, components can be integrated in the module substrate which make it possible to adjust the duplexers to different frequencies. These include, for example, switches or tunable components.

Duplexers and hybrids can in particular be integrated in the form of L, C and R elements in a multilayered module substrate.

Figure 3:
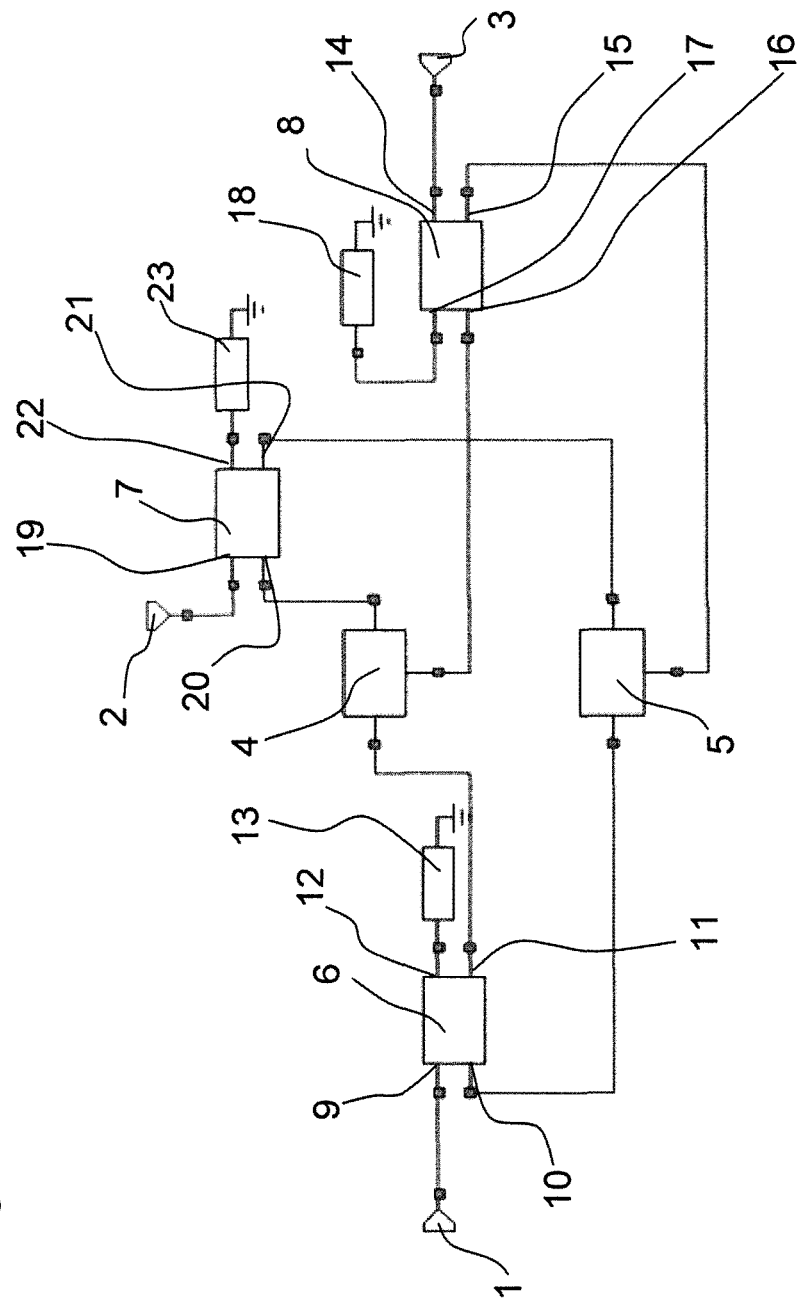
FIG. 3 shows a circuit arrangement according to the invention.

FIG. 3 shows a circuit arrangement according to the invention. This circuit arrangement has a transmission port 1, an antenna port 2 and a reception port 3. Such a circuit arrangement can be used, for example, in mobile radio. In this case, the transmission port 1 and reception port 3 are connected to the same antenna port 2 via different paths. Critical characteristics of such a circuit are the selection and the isolation. The isolation is a measure of what component of a transmission signal reaches the reception port 3 from the transmission port 1. Such a signal is generally undesirable. The signals received by the reception port 3 have only a very low signal strength in mobile radio. It is therefore critical that this signal is not additionally also subject to interference from a parasitic signal from the transmission port 1.

The selection describes the ratio between the emission power in the passband and the loss outside the passband. Owing to the very low reception powers in mobile radio, a high selection of the reception signal and transmission signal is important.

The circuit arrangement according to the invention also has two duplexers 4, 5 and three 90° hybrids 6, 7, 8. The transmission port 1 is connected to a connection 9 of a 90° hybrid 6. An input signal which is present at this connection 9 is output by the 90° hybrid 6 at the connections 10 and 11, wherein the output signals are phase-shifted with respect to one another through 90° and have a signal strength which is lower by approximately 3 dB in comparison with the input signal. A signal is output at the connection 10 which is phase-shifted through $\Phi_2$ with respect to the input signal of the 90° hybrid 6. The signal output at the connection 11 is phase-shifted through the angle $\Phi_1$ with respect to the input signal. Furthermore, a load resistance 13, for example a load resistance 13 of 50Ω, is present at the fourth connection 12 of the 90° hybrid 6. This load resistance ensures impedance matching. The connections 10 and 11 of the 90° hybrid 6 are in each case connected to a duplexer 4 and 5, respectively.

The reception port 3 is likewise connected to a 90° hybrid 8, to be precise to a connection 14 of this 90° hybrid 8. The connections 15 and 16 of this 90° hybrid 8 are likewise in each case connected to a duplexer 4 and 5, respectively. The fourth connection 17 of the 90° hybrid 8 is grounded via a load resistance 18.

The antenna port 2 is connected to a 90° hybrid 7, to be precise to the connection 19 of the 90° hybrid 7. The connections 20 and 21 of this 90° hybrid 7 are in each case connected to a duplexer 4 and 5, respectively. The connection 22 of the 90° hybrid 7 is grounded via a load resistance 23.

The 90° hybrids 6, 7, 8 and the duplexers 4, 5 are interconnected with one another in such a way that transmission signals which reach the reception port 3 owing to a finite isolation of the duplexers 4, 5 cancel one another out in the ideal case.

Figure 4:
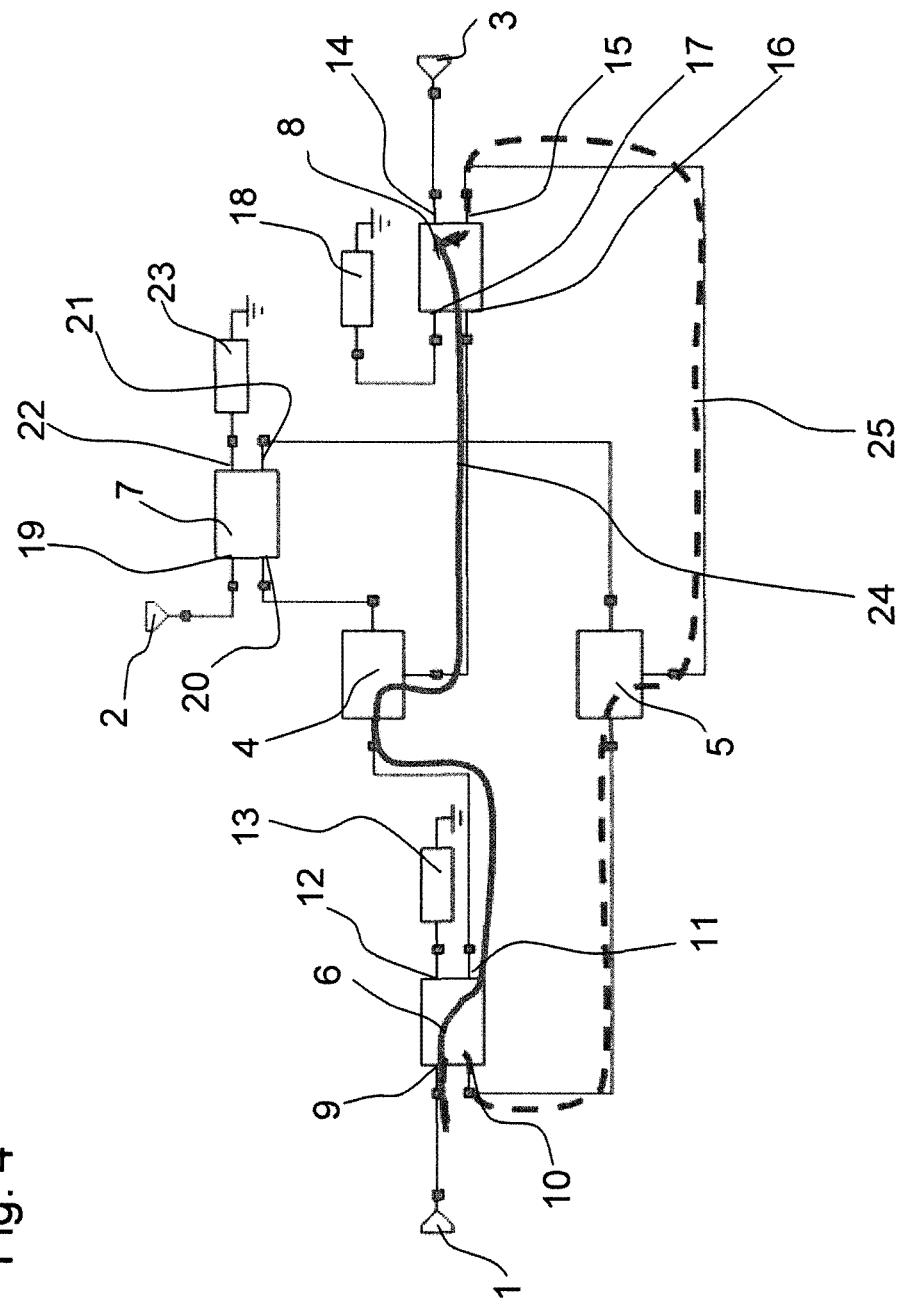
FIG. 4 shows the circuit arrangement shown in FIG. 1, wherein two signal paths are marked between transmission port and reception port.

FIG. 4 shows the circuit arrangement illustrated in FIG. 3, wherein different signal paths 24, 25 between the transmission port 1 and reception port 3 are marked. A signal which emerges from the transmission port 1 is first divided into two output signals, which are phase-shifted relative to one another through 90°, in the 90° hybrid 6, wherein the signal which is output at connection 11 is phase-shifted through $\Phi_1$ with respect to the input signal and the signal which is output at connection 10 is phase-shifted through $\Phi_2$ with respect to the input signal. The output signal output at the connection 11 reaches the duplexer 4 and is passed on to the antenna port 2 at said duplexer via the hybrid 7. Owing to the finite isolation of the duplexer 4, a certain component of the signal is passed on to the 90° hybrid 8 as a parasitic signal, which 90° hybrid is connected to the reception port 3. The 90° hybrid 8 passes the signal on from connection 16 to the connection 14, wherein a phase shift through $\Phi_1$ occurs. Correspondingly, the transmission signal reaches the reception port 3, via the signal path 24 which is marked by a continuous line, with a phase shift of twice $\Phi_1$.

A second component of the signal output from the transmission port 1 is output by the 90° hybrid 6 to the connection 10. In this case, the signal is phase-shifted through $\Phi_2$. This signal now reaches the second duplexer 5. There, it is passed on to the antenna port 2. Owing to the finite isolation, however, a certain signal component is passed on to the 90° hybrid 8, which is connected to the reception port 2. In this 90° hybrid 8, the signal is again phase-shifted through $\Phi_2$, with the result that it reaches the reception port 3 in total with a phase shift of twice $\Phi_2$. In FIG. 4, the signal path 25 is illustrated using a dashed line.

The 90° hybrids are selected in such a way that the following always applies to the two output signals: the magnitude of the difference between the two phase shifts is approximately 90°, $|\Phi_1-\Phi_2|\approx 90°$. Correspondingly, two parasitic signals which have a relative phase shift of ideally −180° with respect to one another reach the reception port 3 via the two signal paths 24, 25. At said reception port 3, said signals cancel one another out owing to destructive interference. In order to achieve correspondence of the signal intensities and phases of the two parasitic signals which is as good as possible, the two duplexers 4, 5 should have an identical design to one another and the lengths of the two signal paths 24, 25 should correspond to one another.

In order to achieve a component part height which is as small as possible, however, the design could result in restrictions in respect of the length of the two signal paths 24, 25. Owing to the design, the path 24 could be slightly longer than the path 25, for example. In order to compensate for such an asymmetrical layout, the 90° hybrids 6, 7, 8 could be adjusted in such a way that the phase shift between the two output signals is not precisely 90°, but deviates slightly from this value. A phase shift of 92° could be selected, for example. For this purpose, the 90° hybrids could be designed for a design frequency which is slightly lower than the actual frequency of a transmission signal. As has already been discussed above in connection with FIG. 2, this results in a relative phase shift between the two output signals of slightly more than 90°.

Naturally, the reverse case is also possible. For design reasons, a relative phase shift between the two output signals of slightly less than 90° could be desired. In this case, the 90° hybrids could be adjusted to a design frequency which is slightly higher than the frequency of the input signal.

Overall, the 90° hybrids 6, 7, 8 therefore make it possible to compensate for small asymmetries in the length of the signal paths 24, 25.

It is also possible for the 90° hybrids to be optimized in terms of a component part size which is as small as possible. In this case, it could be impossible, for design reasons, for the 90° hybrid to be adjusted to a relative phase shift of 90° between the two output signals. In this case, a phase shift predetermined by the 90° hybrids of not precisely 90° could be compensated for by virtue of the fact that a slightly asymmetrical layout is selected.

In the following text, 90° hybrids which output two output signals with a relative phase shift of precisely 90° and a symmetrical layout with identical signal path lengths is assumed, in which case one output signal has a relative phase shift of $\Phi_1$ with respect to the input signal and the other output signal has a relative phase shift of $\Phi_2$ with respect to the input signal. In the ideal case, the following condition applies: $|\phi_2-\Phi_1|=90°$.

The first component of the transmission signal which was conducted from the duplexer 4 in the direction of the antenna port 2 reaches the 90° hybrid 7. Here, this signal is phase-shifted through $\Phi_2$ and output at the connection 19. The second component of the transmission signal is likewise passed on to the antenna port 2 from the duplexer 5. In the 90° hybrid 7, this signal experiences a phase shift through $\Phi_1$. Correspondingly, both signal components have a relative phase shift of 90° in the case of antenna port 2. Correspondingly, said signal components interfere constructively and the signal strengths are added.

Figure 5:
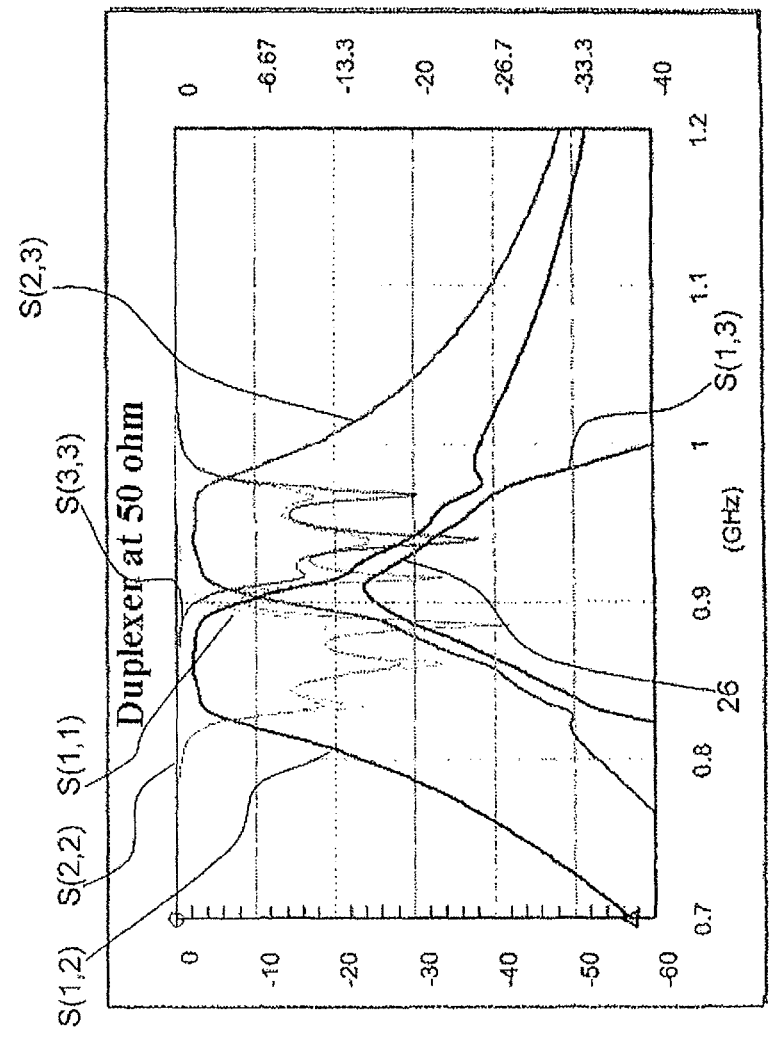
FIG. 5 shows the transmission characteristic and isolation of a tunable duplexer comprising discrete elements.

FIG. 5 shows the transmission characteristic for an individual duplexer formed from discrete elements. In this case, a tunable duplexer is assumed. The curve $S_{21}$ describes the insertion loss of the Tx filter, i.e., the transmission from the transmission port 1 to the antenna port 2 depending on the frequency of the signal. The curve $S_{32}$ describes the insertion loss of the Rx filter, i.e., the transmission from the antenna port 2 to the reception port 3 depending on the frequency of the signal. The curve $S_{31}$ describes the isolation of the duplexer, i.e., the transmission of a signal from the transmission port 1 to the reception port 3.

In this case, the transmission channel is at 880 MHz, and the reception channel is at 925 MHz. Since a tunable duplexer has been used here, the duplexer does not cover the entire frequency band, as defined in the mobile radio standards WCDMA (Wideband Code Division Multiple Access) or LTE (Long Term Evolution). All of the ports of the duplexer are terminated with 50Ω. The marking 26 in FIG. 5 indicates the isolation at the frequency of the reception channel. At a frequency of 0.925 GHz, an isolation of less than 30 dB, in particular 28 dB, is present. This isolation is insufficient for WCDMA applications.

Furthermore, the curve $S_{11}$ describes the reflection at the transmission port 1. The curve $S_{22}$ indicates the feedback loss at the antenna port, and the curve $S_{33}$ describes the feedback loss at the reception port 3. The dB scale plotted on the right-hand side applies for these three curves $S_{11}$, $S_{22}$ and $S_{33}$.

Figure 6:
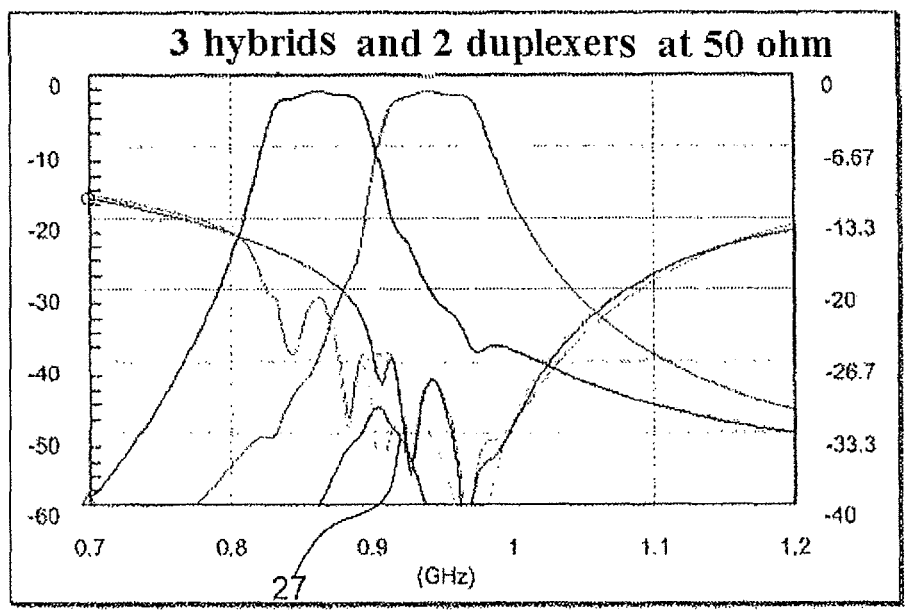
FIG. 6 shows the transmission characteristic and isolation of a circuit arrangement according to the invention having three 90° hybrids and two tunable duplexers comprising discrete elements.

FIG. 6 shows the transmission characteristic for a circuit arrangement in accordance with the present invention. In the curve shown in FIG. 6, duplexers 4, 5 comprising discrete elements are used and all of the ports 1, 2, 3 are terminated with 50Ω. FIG. 6 shows the transmission characteristic for a circuit arrangement with tunable duplexers. However, circuit arrangements with duplexers comprising rigid, fixed, discrete elements are also possible within the context of the invention.

Precisely as in FIG. 5, the curve $S_{21}$ describes the insertion loss of the Tx filter, i.e., the transmission from the transmission port 1 to the antenna port 2 depending on the frequency of the signal. The curve $S_{32}$ describes the insertion loss of the Rx filter, i.e., the transmission from the antenna port 2 to the reception port 3 depending on the frequency of the signal. The curve $S_{31}$ describes the isolation of the duplexer, i.e., the transmission of a signal from the transmission port 1 to the reception port 3.

The marking 27 indicates the isolation at the frequency of the reception channel. At a frequency of 0.925 GHz, an isolation of more than 50 dB is present. Therefore, by virtue of the circuit arrangement according to the invention, the isolation can be improved by more than 20 dB in comparison with a single duplexer, as shown in FIG. 5.

Figure 7:
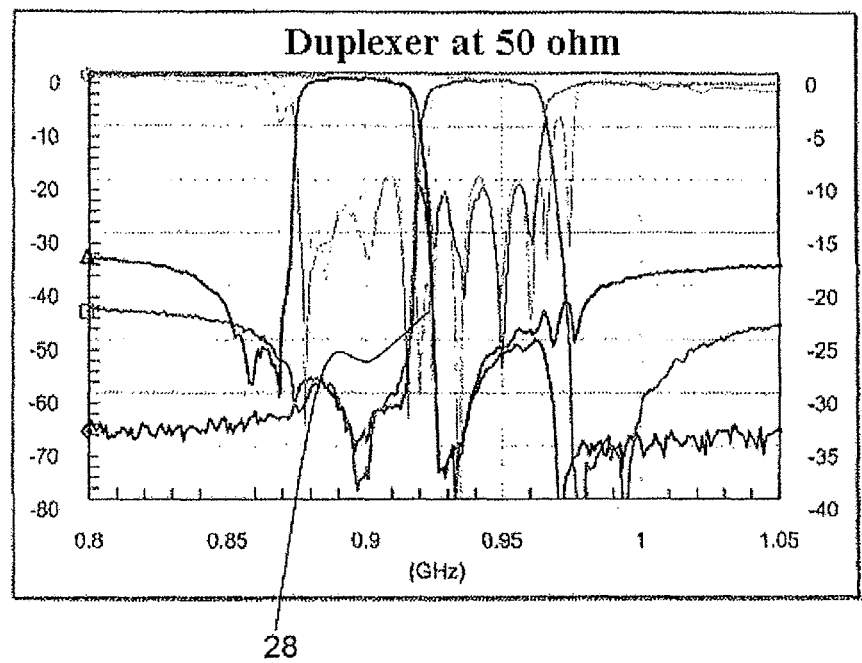
FIG. 7 shows the transmission characteristic and isolation of a SAW duplexer.
Figure 8:
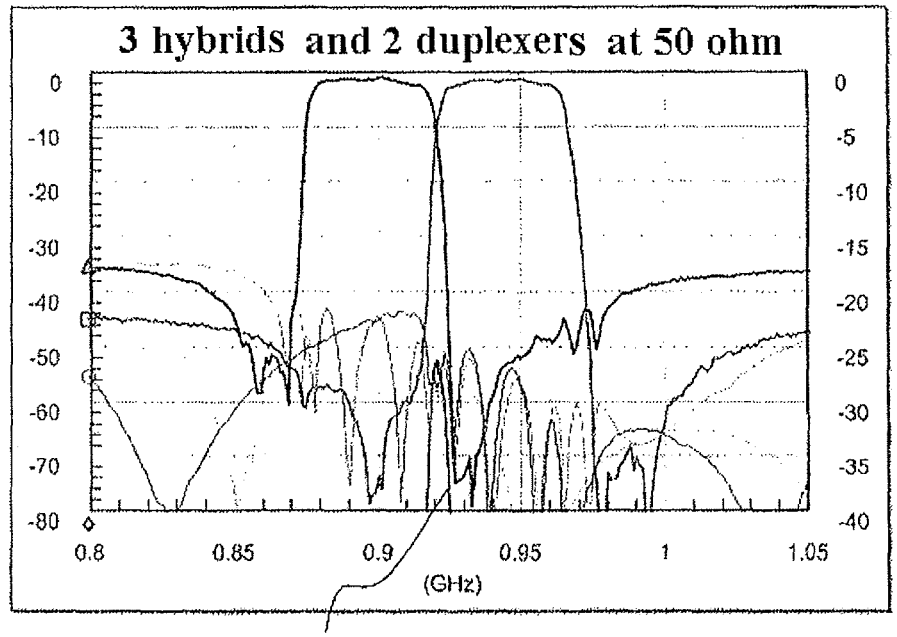
FIG. 8 shows the transmission characteristic and isolation of a circuit arrangement according to the invention having three 90° hybrids and two SAW duplexers.

By virtue of the use of duplexers 4, 5 with acoustic components, the isolation can be further improved. FIG. 7 shows the transmission characteristic of a SAW duplexer and FIG. 8 shows the transmission characteristic of a circuit arrangement according to the invention having three 90° hybrids 6, 7, 8 and two SAW duplexers 4, 5. The duplexers in FIGS. 7 and 8 are each designed for band VIII.

FIG. 7 shows the marking 28 to indicate that a single SAW duplexer reaches an isolation of 45 dB for a reception frequency of 0.925 GHz. Correspondingly, a SAW duplexer per se already provides isolation which meets the requirements defined in the standards.

By virtue of the circuit arrangement according to the invention and the use of SAW duplexers, the isolation can be further improved still, however. FIG. 8 shows that a circuit arrangement according to the invention having two SAW duplexers 4, 5 enables even an isolation of more than −70 dB for the reception frequency of 0.925 GHz. The corresponding point on the curve $S_{13}$ is indicated by the marking 29. Overall, FIGS. 7 and 8 show that the isolation can be improved by almost 30 dB by the circuit arrangement according to the invention.

Such an improvement in the isolation provides marked advantages in respect of the design freedom when configuring the circuit. It is conceivable to use circuit arrangements in the form of ladder and lattice filters, which have a lower number of resonators in the filters. As a result, the chip size can be reduced. It is also possible to configure the circuit in such a way that the improved isolation is traded for improved insertion loss, in particular since a signal strength which is reduced by approximately 3 dB is present at the duplexers 4, 5 in the case of the circuit arrangement according to the invention and the duplexers 4, 5 can be designed for lower maximum signals.

A further advantage of the circuit arrangement according to the invention consists in improvements in the impedance matching of the transmission and reception ports. In the case of real antennas, the impedance changes during use by interaction with the users.

The curves $S_{11}$ and $S_{33}$ in FIG. 7 show that the reflection loss at the transmission port 1 and at the reception port 3 for an individual SAW duplexer, in which the antenna port 2 is terminated with precisely 50Ω, is in the passband up to −20 dB. FIG. 8 shows that, in the case of a circuit according to the invention, the reflection losses at the transmission and reception ports are markedly lower. In the passband, the reflection losses are in this case less than −40 dB.

Figure 9:
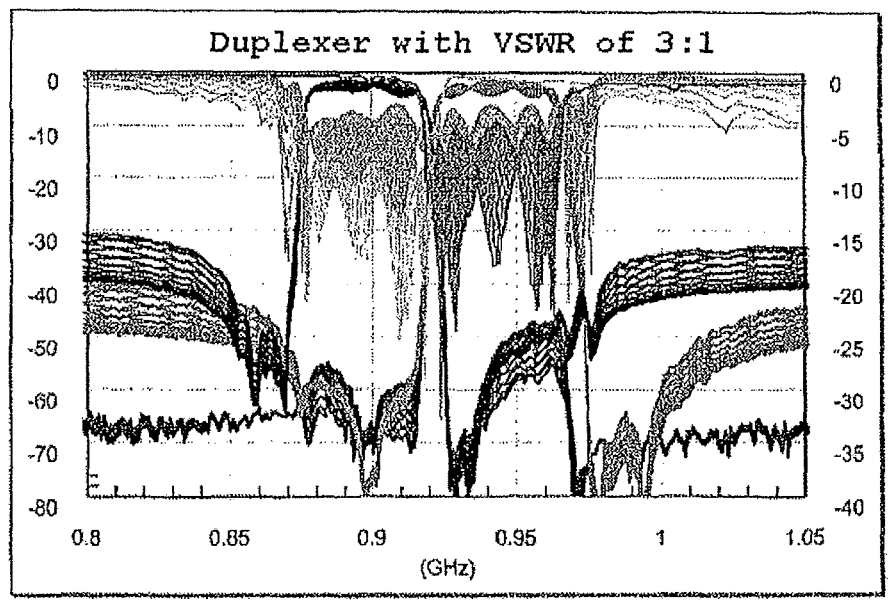
FIG. 9 shows the transmission characteristic and isolation of a SAW duplexer given standing wave ratios of 3:1 and different load angles.

The circuit arrangement according to the invention is robust with respect to changes in the impedance at the antenna port. FIG. 9 shows the transmission characteristic and the isolation of a band VIII SAW duplexer at a standing wave ratio of 3:1 at the antenna port, wherein various load angles of from 0° to 360° in increments of 30° are illustrated. FIG. 9 shows that the insertion loss of the Tx filter and of the Rx filter in the passband is subject to fluctuations of more than 2 dB. These fluctuations can be attributed to incorrect matching in the case of the antenna port, which can be brought about by the user, for example.

Figure 10:
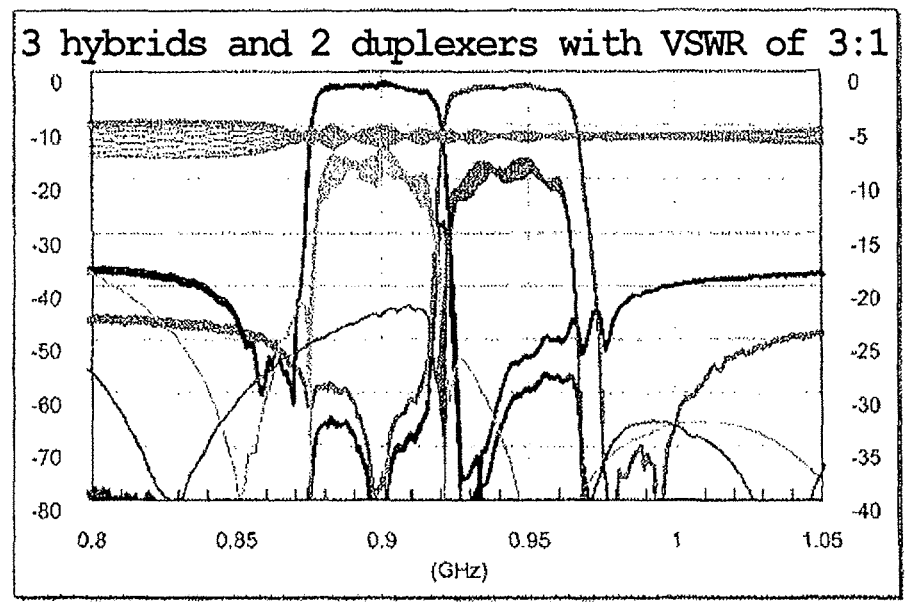
FIG. 10 shows the transmission characteristic and isolation of a circuit arrangement according to the invention having three 90° hybrids and two SAW duplexers given standing wave ratios of 3:1 and different load angles.

FIG. 10 shows the transmission characteristic of a circuit arrangement according to the invention with SAW duplexers and 90° hybrids. FIGS. 9 and 10 also show that losses in the signal transmission from the transmission or reception port to the antenna can be avoided in the case of a circuit arrangement according to the invention. If a circuit arrangement according to the invention is used, the insertion loss of the Tx filter and of the Rx filter becomes more constant in the passband. The insertion loss is now only subject to oscillations with an amplitude of less 0.5 dB.

A comparison of FIGS. 9 and 10 also shows that, even given a standing wave ratio of 3:1 at the antenna port, the isolation is markedly improved by the circuit according to the invention. An individual duplexer has a minimum isolation of −42 dB in the case of a reception channel of 0.925 GHz. In contrast, the circuit according to the invention reaches a minimum isolation of −52 dB, depending on the erroneous matching at the antenna, for this case.

Even in respect of the reflection losses $S_{11}$, $S_{22}$, $S_{33}$, improvements are achieved by virtue of the circuit arrangement according to the invention. In FIG. 9, the reflection loss for an individual duplexer is −5 dB at the antenna port, −10 dB at the transmission port and −15 dB at the reception port. In the case of the circuit according to the invention, these values can be improved. The reflection loss at the antenna port can be improved to −10 dB and at the transmission and reception port in each case to more than −15 dB.

Since, overall, the isolation of the circuit arrangement is decisively improved, it is now possible to use component parts which themselves do not provide sufficient isolation. Particular examples here are tunable duplexers. These duplexers can be adjusted to desired frequencies within a frequency band.

A duplexer which is not adjustable in terms of its frequency always needs to cover the entire passband which is defined in a standard. For the band 8, for example, the passband of the transmission port extends from 880 MHz to 915 MHz and, correspondingly for the transmission port, from 925 MHz to 960 MHz. Within these passbands, various transmission and reception channels can be selected. In this case, the transmission and reception channels are each selected such that they have a frequency difference of 45 MHz, the so-called duplex spacing. If, on the other hand, a duplexer with adjustable frequency is used, the transmission characteristic of this duplexer can be selected such that it is adjusted precisely to the transmission and reception channels used and utilizes the entire duplex spacing of 45 MHz in order to maximize the isolation of the transmission and reception ports. This is shown in FIGS. 11 and 12.

Figure 11:
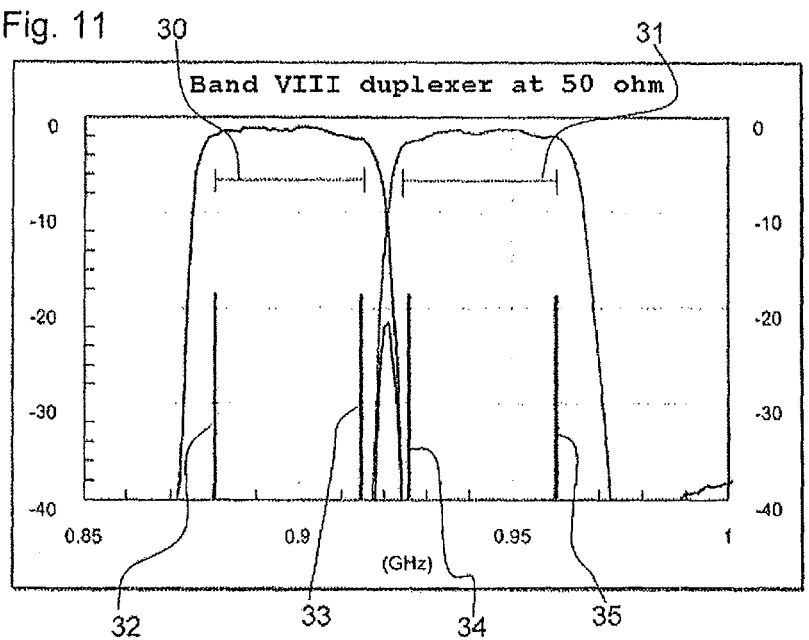
FIG. 11 shows the transmission characteristic and isolation of a SAW duplexer, which cannot be adjusted in terms of frequency within a frequency band.

FIG. 11 shows the transmission characteristic of a duplexer which is not tunable in terms of frequency for band 8. The passbands 30 and 31 for transmission and reception are plotted. In this case, the outermost channels 32, 33, 34, 35 which limit these passbands 30, 31 are plotted. If a transmission channel 32 with a frequency of 880 MHz is used, the corresponding reception channel 34 has a frequency of 925 MHz. At the opposite end of the spectrum, the transmission channel 33 has a frequency of 915 MHz and the reception channel 35 has a frequency of 960 MHz. Since it is not known a priori which transmission and reception channel is used, the transmission characteristic of the duplexer must always be selected such that the transmission passband 30 and the reception passband 31 is completely covered.

Figure 12:
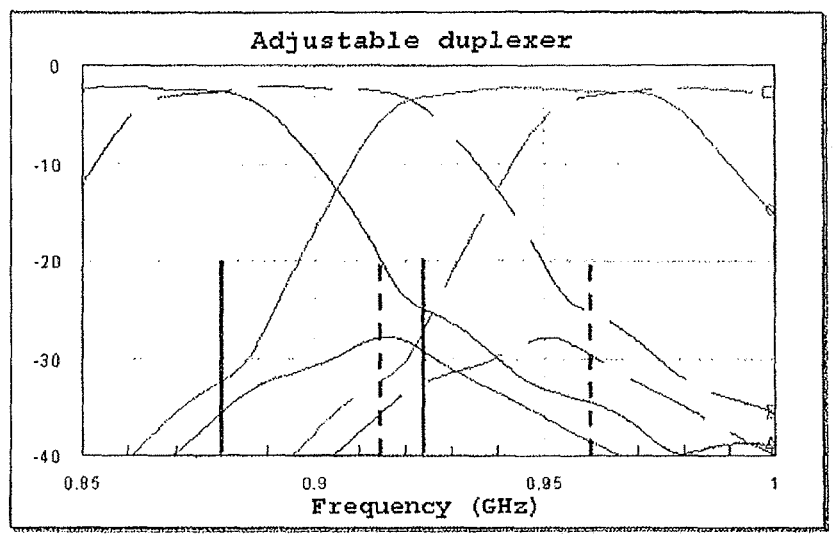
FIG. 12 shows the transmission characteristic and isolation of a tunable duplexer for various adjustments.

FIG. 12 shows the corresponding transmission characteristic for a duplexer which can be adjusted to different frequencies within a frequency band. For this purpose, the duplexer is now adjusted in such a way that the higher-frequency, right-hand corner of the passband for the transmission filter corresponds to the transmission channel used. The lower-frequency, left-hand passband corner of the adjustable reception filter corresponds to the reception channel used. Correspondingly, the duplexer now does not need to cover the entire passband, but only the actual channels used. FIG. 12 shows that, as a result, the isolation of the transmission and reception ports is improved.

If a circuit arrangement according to the invention with tunable duplexers is used, the transmission characteristic is adjusted in such a way that the insertion loss of the Tx filter in the passband for the frequency of the transmission channel used at that time becomes minimal (=maximum of the curve) and increases considerably in the region of the duplex spacing between the transmission channel used at that time and the reception channel used at that time. In addition, the transmission characteristic is adjusted in such a way that the insertion loss of the Rx filter in the passband for the frequency of the reception channel used at that time becomes minimal (=maximum of the curve) and increases considerably in the region of the duplex spacing between the reception channel used at that time and the transmission channel used at that time.

FIG. 12 illustrates the two extreme cases for the selection of the respective transmission/reception channel. The continuous lines describe the transmission characteristic for the lowermost channel 32 of the transmission passband 30 with 880 MHz and correspondingly the lowermost channel 34 of the reception passband 31 with 925 MHz. The dashed lines describe the transmission characteristic of the uppermost channel 33 of the transmission passband 30 with 915 MHz and correspondingly the uppermost channel 35 of the reception passband 31 with 960 MHz.

Figure 13:
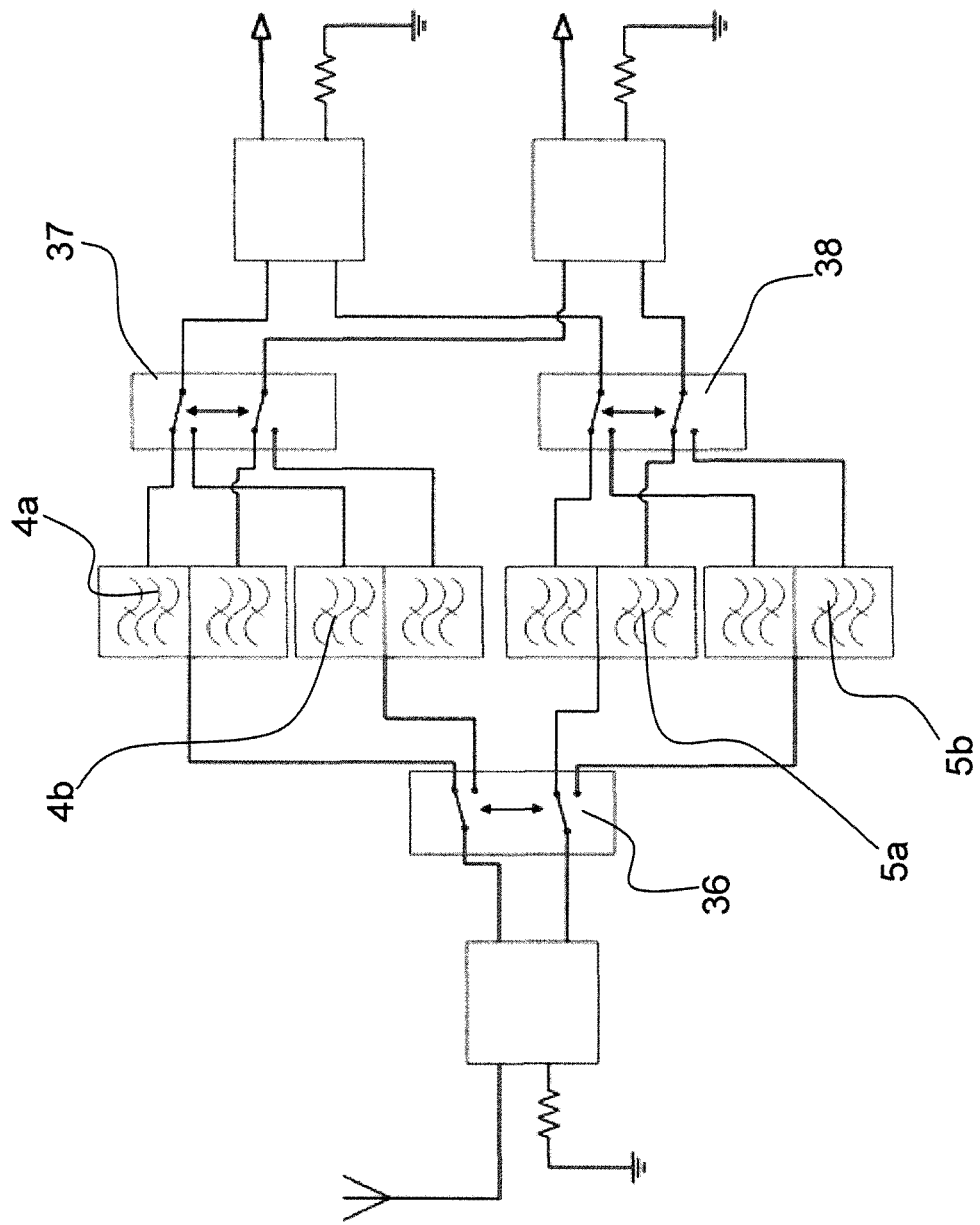
FIG. 13 shows a circuit arrangement according to the invention, in which it is possible to switch over between different frequency bands.

FIG. 13 shows a further configuration of a circuit arrangement according to the invention, in which it is possible to switch over between different mobile radio bands. FIG. 13 shows an embodiment for two bands V and VIII. However, the invention is not restricted to two bands, but can also be designed for three or more bands. The circuit arrangement has two duplexers 4a, 5a and 4b, 5b for each frequency band. It is possible to switch over between these duplexers 4a, 4b, 5a, 5b via three switches 36, 37, 38. These switches 36, 37, 38 are each interconnected between the 90° hybrids 6, 7, 8 and duplexers 4a, 4b, 5a, 5b. In other words, each 90° hybrid 6, 7, 8 is connected to in each case two duplexers via a switch 36, 37, 38. For transmissions in the frequency band V, the switches 36, 37, 38 are switched in such a way that the 90° hybrids 6, 7, 8 are connected to the corresponding duplexers 4a, 5a for the band V. This case is illustrated in FIG. 13. Correspondingly, in the case of transmissions in the frequency band VIII, the switches 36, 37, 38 are switched in such a way that the 90° hybrids 6, 7, 8 are connected to the corresponding duplexers 4b, 5b for the band VIII. Since the signals of the ports 1, 2, 3 in the 90° hybrids are divided into two signals with a signal strength which is lower by approximately 3 dB, in each case only half the signal strength is present at the switches 36, 37, 38. This makes it possible to use switches with a lower power with low insertion loss.

Figure 14:
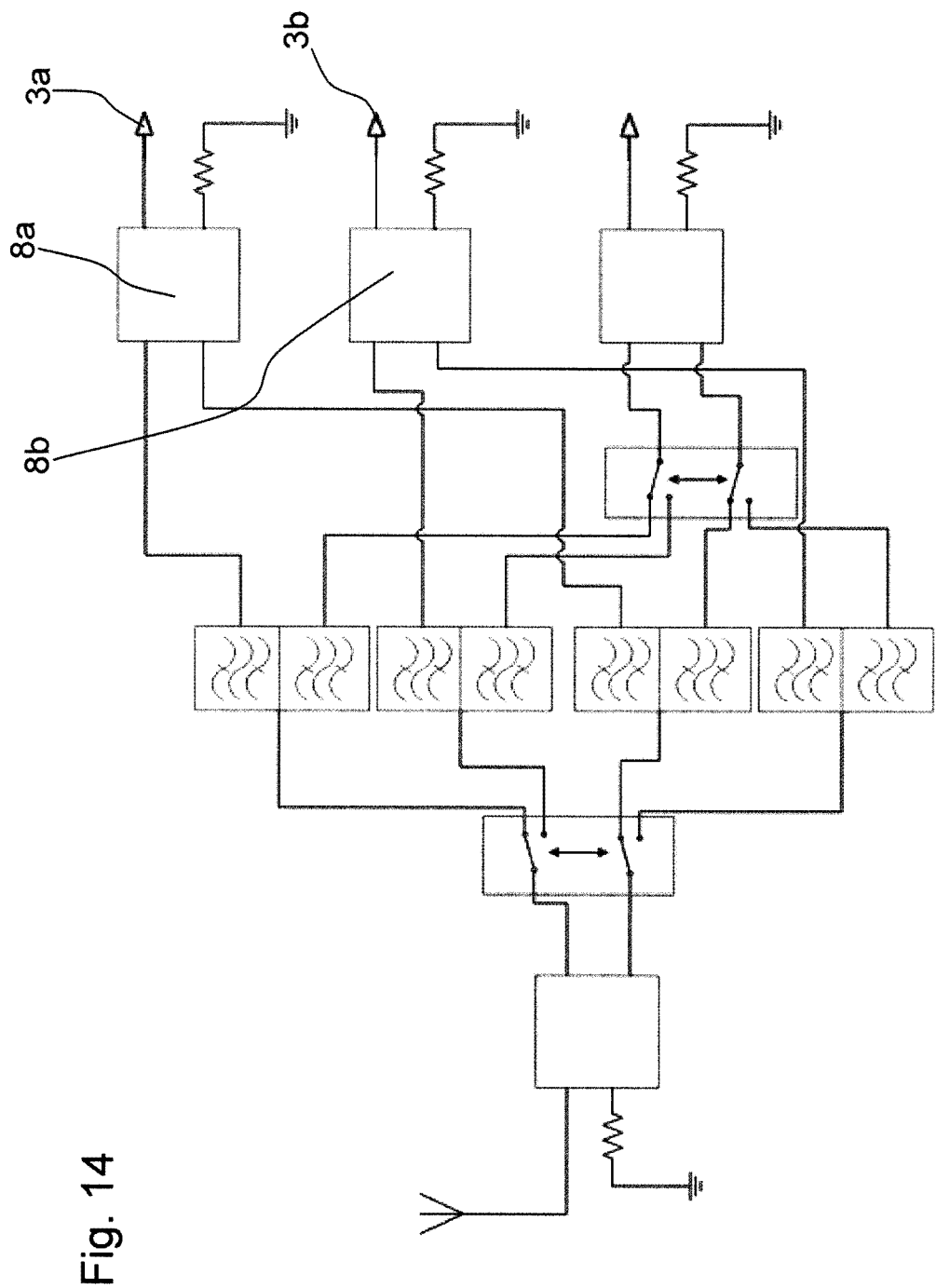
FIG. 14 shows a similar circuit arrangement to that shown in FIG. 11, wherein in this case a dedicated reception port is provided for each frequency band.

FIG. 14 shows a further configuration of a circuit arrangement according to the invention. The circuit arrangement shown in FIG. 14 substantially corresponds to the circuit arrangement shown in FIG. 13, but now a separate reception port 3a, 3b is provided for each band V, VIII. A dedicated 90° hybrid 8a, 8b is associated with each of these separate reception ports 3a, 3b. The precise configuration of the transmission and reception ports is dependent on the interfaces between the circuit arrangement and further component parts, such as an amplifier, for example, and the rest of the circuit. The configuration shown in FIG. 14 is used when the transceiver circuit provides separate low-noise amplifiers (LNA) for each frequency band and correspondingly separate interfaces are required for each frequency band.

Figure 15:
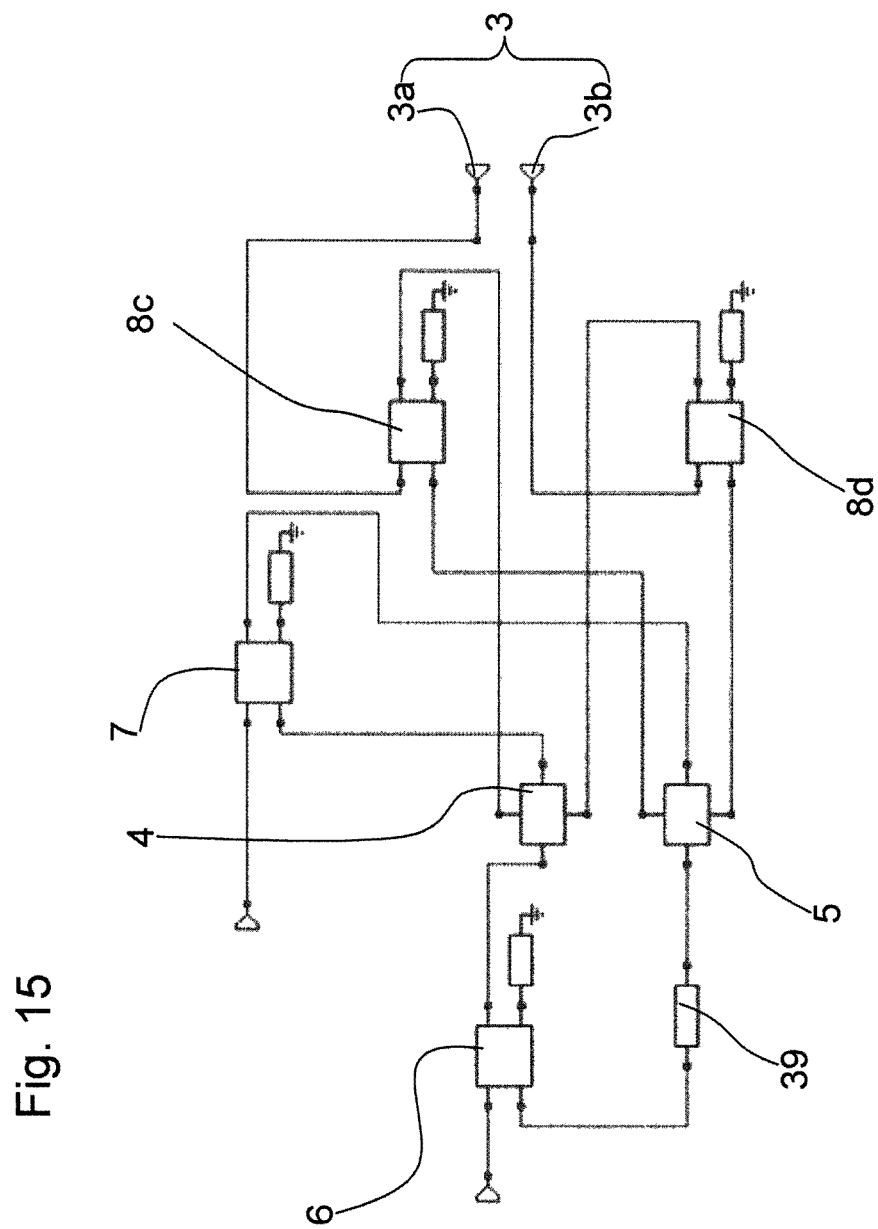
FIG. 15 shows a configuration of the circuit arrangement according to the invention with unbalanced/balanced duplexers and a balanced reception port.

FIG. 15 shows a further alternative configuration of a circuit arrangement according to the invention. The two duplexers 4, 5 in this case have two connections for the reception channel. They are also referred to as balanced duplexers. In addition, the reception port 3 is also balanced and correspondingly has two inputs 3a and 3b.

In comparison with the circuit arrangement shown in FIG. 3, one 90° hybrid 8, which is connected to the reception port 3, is replaced by two 90° hybrids 8c, 8d. The two 90° hybrids 8c, 8d are each connected to one of the two inputs 3a and 3b of the reception port 3.

In the circuit arrangement according to the invention, therefore, a 90° hybrid is provided for each single port in the circuit arrangement. If a port is balanced, each input is connected to a separate 90° hybrid. In general, a circuit arrangement with n ports also has n 90° hybrids, wherein a balanced port with two inputs is counted twice.

The circuit arrangement shown in FIG. 15 also has a transmission line 39 in the lower signal path 25 between the 90° hybrid 6 and the duplexer 5. Here, consideration is given to an example in which the 90° hybrids 6, 7, 8a, 8b are not ideal and the two output signals which are each output by the 90° hybrids 6, 7, 8c, 8d have a phase shift which deviates slightly from 90°. In order that the signals at the reception port 8 nevertheless interfere destructively, an asymmetric layout is selected. For this purpose, the transmission line 39 is arranged in the signal path 25. This ensures a phase shift of the corresponding signal, with the result that the two signals which pass from the transmission port 1 to the reception port 3 on the signal paths 24 and 25 in turn have a relative phase shift of 180° at the reception port 8 and correspondingly interfere destructively.

FIG. 15 shows a circuit arrangement in which only one reception channel is used, which covers the frequency band V, for example. However, the invention is not restricted to this embodiment. Thus, the exemplary embodiment shown in FIG. 15 with a balanced Rx port can be combined with the embodiment shown in FIGS. 13 and 14, in which means for switchover between different frequency bands are provided, without any problems.

A further alternative configuration of the present invention is not illustrated in the Figures. In this case, the circuit arrangement according to the invention has a diplexer. The diplexer can also be integrated in the circuit arrangement or one of the duplexers can be replaced by a diplexer. While a duplexer connects an antenna to an input and an output, a diplexer isolates two inputs or two outputs and connects said inputs or outputs to an antenna. If a diplexer is used for the circuit arrangement according to the invention, said diplexer should be interconnected in such a way that in turn two signal paths are provided between the transmission port 1 and the reception port 3, wherein the signal paths have a relative phase shift at approximately 180° with respect to one another.

The invention claimed is:

1. A circuit arrangement comprising:
   an antenna port;
   a transmission port;
   a reception port;
   three 90° hybrids, each 90° hybrid is configured to divide an input signal into two output signals that have a relative phase shift of 90° with respect to one another, wherein the antenna port, the transmission port and the reception port are each connected to at least one 90° hybrid; and
   two duplexers interconnected in such a way that the two output signals output by the 90° hybrid connected to the transmission port constructively interfere at the antenna port and parasitic signals caused by the two output signals destructively interfere at the reception port, wherein the duplexers comprise tunable elements.

2. The circuit arrangement according to claim 1, wherein each duplexer includes three connections and wherein both duplexers have the three connections connected to a 90° hybrid.

3. The circuit arrangement according to claim 1,
   wherein one of the two duplexers is connected to the 90° hybrid connected to the reception port and the 90° hybrid connected to the transmission port in such a way that the 90° hybrids each output an output signal, which is phase-shifted relative to its input signal through an angle $\Phi_1$, to the duplexer,
   wherein the other of the two duplexers is connected to the 90° hybrid connected to the reception port and the 90° hybrid connected to the transmission port in such a way that the 90° hybrids each output an output signal, which is phase-shifted relative to its input signal through an angle $\Phi_2$, to the duplexer,
   wherein a magnitude of a difference between the two angles $\Phi_1$ and $\Phi_2$ is approximately 90°, and
   wherein the two duplexers are each connected to one of the outputs of the 90° hybrid connected to the antenna port.

4. The circuit arrangement according to claim 3, wherein the angle $\Phi_1$ is approximately equal to 0° and wherein the angle $\Phi_2$ is approximately equal to 90°.

5. The circuit arrangement according to claim 3, wherein the angle $\Phi_1$ is approximately equal to −45° and wherein the angle $\Phi_2$ is approximately equal to 45°.

6. The circuit arrangement according to claim 1, wherein the two duplexers are each tunable in terms of frequency within a frequency band.

7. The circuit arrangement according to claim 6, wherein the duplexers are adjusted in such a way that an insertion loss of a transmission passband for the frequency of a transmission channel used at that time is minimal and increases considerably between the transmission channel used at that time and a reception channel used at that time.

8. The circuit arrangement according to claim 6, wherein the duplexers are adjusted such that an insertion loss of a reception passband for the frequency of a reception channel used at that time is minimal and increases considerably between a transmission channel used at that time and the reception channel used at that time.

9. The circuit arrangement according to claim 1,
   wherein the 90° hybrids comprise discrete elements, or
   wherein the 90° hybrids are microstrip conductors.

10. The circuit arrangement according to claim 1,
    wherein the duplexers comprise discrete elements, or
    wherein the duplexers contain acoustic components.

11. The circuit arrangement according to claim 10, in which the duplexers contain SAW duplexers, BAW duplexers or hybrid duplexers, which have both SAW transducers and BAW transducers.

12. The circuit arrangement according to claim 1, wherein the duplexers have high-pass filters and low-pass filters.

13. The circuit arrangement according to claim 1, wherein the relative phase shifts of the 90° hybrids are adjusted such that asymmetries in a layout of the circuit arrangement are compensated for.

14. The circuit arrangement according to claim 1, wherein discrepancies in the relative phase shift of the output signals output by the 90° hybrids are compensated for by an asymmetric layout of the circuit arrangement.

15. The circuit arrangement according to claim 1,
    wherein the circuit arrangement is configured to process a plurality of different frequency bands;
    wherein the circuit arrangement comprises two duplexers for each frequency band, and
    wherein the circuit arrangement comprises a switchover circuit to switch between different duplexers and frequency bands.

16. The circuit arrangement according to claim 15, wherein the circuit arrangement comprises a separate reception port for each frequency band, each of the reception ports being connected to a dedicated 90° hybrid that includes outputs that are interconnected with the two duplexers of the respective frequency band, wherein the switchover circuit is configured to connect the transmission port selectively to duplexers associated with different frequency bands.

17. The circuit arrangement according to claim 1, wherein the reception port is balanced.

18. A module comprising a circuit arrangement according to claim 1.

19. The module according to claim 18, wherein duplexers and/or the 90° hybrids are integrated in a substrate of the module.

20. The module according to claim 19, wherein the duplexers and the 90° hybrids are integrated in the form of L, C and R elements in a multilayered module substrate.

21. A device for wireless communication in a radio frequency range, the device comprising a front-end module according to claim 18.

22. A device for wireless communication in a radio frequency range, the device comprising a circuit arrangement according to claim 1.

23. A circuit arrangement comprising:
    an antenna port;
    a transmission port;
    a reception port;
    three 90° hybrids, each 90° hybrid dividing an input signal into two output signals that have a relative phase shift of 90° with respect to one another, wherein the antenna port, the transmission port and the reception port are each connected to at least one 90° hybrid; and
    two duplexers interconnected in such a way that the two output signals output by the 90° hybrid connected to the transmission port constructively interfere at the antenna port and parasitic signals caused by the two output signals destructively interfere at the reception port,
    wherein the circuit arrangement is configured to process a plurality of different frequency bands,
    wherein the circuit arrangement comprises two duplexers for each frequency band, wherein the circuit arrangement comprises a switchover circuit to switch between different duplexers and frequency bands, and wherein the switchover circuit is between the 90° hybrids and the duplexers or wherein the switchover circuit is directly connected to the duplexers.

24. A circuit arrangement comprising:

an antenna port;

a transmission port;

a reception port;

three 90° hybrids, each 90° hybrid is configured to divide an input signal into two output signals that have a relative phase shift of 90° with respect to one another, wherein the antenna port, the transmission port and the reception port are each connected to at least one 90° hybrid; and two duplexers interconnected in such a way that the two output signals output by the 90° hybrid connected to the transmission port constructively interfere at the antenna port and parasitic signals caused by the two output signals destructively interfere at the reception port, wherein the circuit arrangement is configured to process a plurality of different frequency bands, wherein the circuit arrangement comprises two duplexers for each frequency band, wherein the circuit arrangement comprises a switchover circuit to switch between different duplexers and frequency bands, wherein the circuit arrangement comprises a separate reception port for each frequency band, each of the reception ports being connected to a dedicated 90° hybrid that includes outputs that are interconnected with the two duplexers of the respective frequency band, and wherein the switchover circuit is configured to connect the transmission port selectively to duplexers associated with different frequency bands.

25. A circuit arrangement comprising:

an antenna port;

a transmission port;

a reception port, wherein the reception port is balanced;

three 90° hybrids, each 90° hybrid is configured to divide an input signal into two output signals that have a relative phase shift of 90° with respect to one another, wherein the antenna port, the transmission port and the reception port are each connected to at least one 90° hybrid; and two duplexers interconnected in such a way that the two output signals output by the 90° hybrid connected to the transmission port constructively interfere at the antenna port and parasitic signals caused by the two output signals destructively interfere at the reception port.

\* \* \* \* \*